United States Patent
Mori et al.

(10) Patent No.: US 7,320,602 B2
(45) Date of Patent: Jan. 22, 2008

(54) SUBSTRATE STRUCTURE, SUBSTRATE MANUFACTURING METHOD AND ELECTRONIC DEVICE

(75) Inventors: Tokihiko Mori, Kunitachi (JP); Sadao Makita, Hanno (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/635,224

(22) Filed: Dec. 7, 2006

(65) Prior Publication Data
US 2007/0149025 A1    Jun. 28, 2007

(30) Foreign Application Priority Data
Dec. 22, 2005 (JP) ............................ 2005-369480

(51) Int. Cl.
*H01R 12/00* (2006.01)
(52) U.S. Cl. .......................... 439/66; 439/331
(58) Field of Classification Search .................. 439/64, 439/65, 66, 68, 70, 330, 331

See application file for complete search history.

(56) References Cited

U.S. PATENT DOCUMENTS

| 4,268,102 | A | * | 5/1981 | Grabbe | 439/331 |
| 5,324,569 | A | | 6/1994 | Nagesh | |
| 5,460,538 | A | * | 10/1995 | Ikeya | 439/331 |
| 6,162,066 | A | * | 12/2000 | Glick et al. | 439/73 |
| 6,749,443 | B2 | * | 6/2004 | Sano et al. | 439/71 |
| 6,763,581 | B2 | | 7/2004 | Hirai | |
| 2005/0106904 | A1 | | 5/2005 | Yoshida | |

FOREIGN PATENT DOCUMENTS

JP    6-268366    9/1994

* cited by examiner

*Primary Examiner*—Khiem Nguyen
(74) *Attorney, Agent, or Firm*—Knobbe Martens Olson & Bear LLP

(57) ABSTRACT

According to one embodiment, there is provided a substrate structure including a printed-wiring board. A micro-contact sheet is soldered to the printed-wiring board, and includes a spiral terminal on a first surface thereof and a pad on a second surface thereof. The pad is electrically connected to the spiral terminal. A holding jig presses the micro-contact sheet against the printed-wiring board such that the second surface of the micro-contact sheet contacts with the printed-wiring board.

11 Claims, 6 Drawing Sheets

SUBSTRATE STRUCTURE, SUBSTRATE MANUFACTURING METHOD AND ELECTRONIC DEVICE

CROSS-REFERENCE TO RELATED APPLICATIONS

This application is based upon and claims the benefit of priority from Japanese Patent Application No. 2005-369480, filed Dec. 22, 2005, the entire contents of which are incorporated herein by reference.

BACKGROUND

1. Field

One embodiment of the invention relates to a substrate structure, a substrate manufacturing method, and an electronic device which is able to be applied to a case where an electronic component having a multi-pin structure is mounted.

2. Description of the Related Art

A box-shaped socket member is known as a fixing device for fixing, to a printed-wiring board, an electronic component which is easily affected by heat stress. This socket member includes a board having contact terminals and a frame body fixed to the board so as to surround an electronic component. The frame body houses, for example, a BGA (Ball Grid Array) semiconductor package as an electronic component to be mounted therein. A substrate structure which mounts an electronic component by using the socket member is manufactured by arranging the socket member on a printed-wiring board, and solder-bonding the socket member to the printed-wiring board through reflowing. An electronic component to be mounted, for example, a semiconductor package, is attached to the socket member provided on the board. As a result, the semiconductor package is mounted on the board.

In such a substrate structure, the socket member is soldered on the board. Thus, when the board (printed-wiring board) is warped due to the heat in reflowing or other factors, the socket member may be partially separated from the board. Hence, a crack may be generated in the soldered portion, or pattern detachment or a short circuit may occur in portions other than the soldered portion. Conventionally, as for techniques for solving such a kind of problem, there is a technique which places a contact spacer using a metal ball between a semiconductor carrier and a board, and melting the metal ball so as to mechanically and electrically connect the semiconductor carrier and the board to each other (for example, see Japanese Patent Application KOKAI Publication No. H06-268366).

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, there is provided a substrate structure including: a printed-wiring board; a micro-contact sheet soldered to the printed-wiring board, and including a spiral terminal on a first surface thereof and a pad on a second surface thereof, the pad being electrically connected to the spiral terminal; and a holding jig which presses the micro-contact sheet against the printed-wiring board such that the second surface of the micro-contact sheet contacts with the printed-wiring board.

Figure 1:
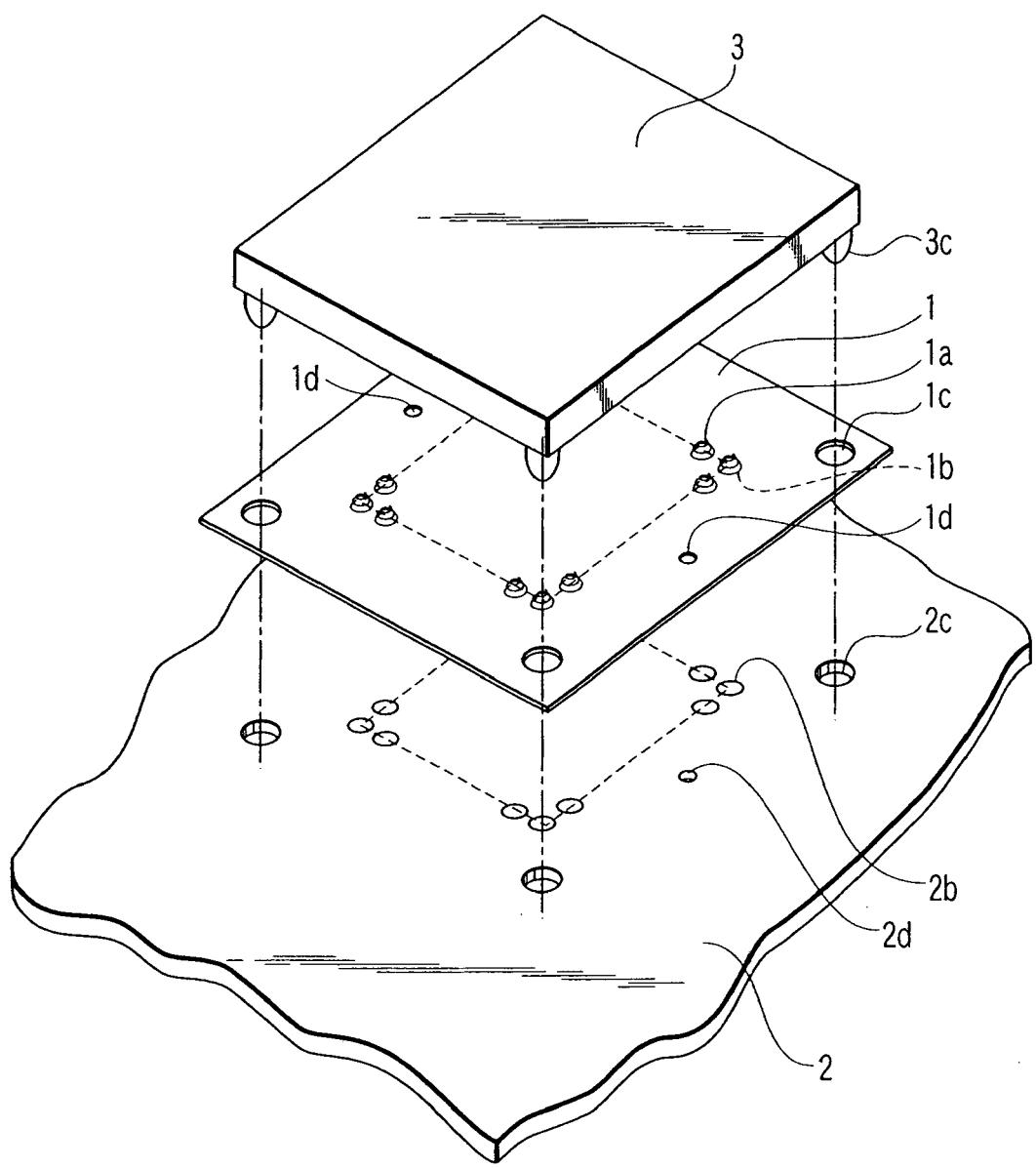
FIG. 1 is an exemplary exploded perspective view of a substrate structure according to an embodiment of the invention.

As shown in FIG. 1, a substrate structure according to an embodiment of the invention is realized by including a micro-contact sheet 1, a printed-wiring board 2, and a sheet holding jig 3.

The micro-contact sheet 1 is formed by a rectangular flexible sheet member. The sheet member includes spiral terminals 1a, 1a, . . . on one side thereof and includes pads 1b, 1b, . . . corresponding to the spiral terminals on the other side thereof. The spiral terminals 1a, 1a, . . . are each made of a thin metal film having elasticity and formed into a spiral shape having a protruding end. The terminals 1a, 1a, . . . are arranged in a matrix so as to correspond to respective terminals of a multi-pin device to be mounted on the printed-wiring board (a board obtained by solder-mounting the micro-contact sheet 1 on the printed-wiring board) 2. The terminals 1a, 1a, . . . are pressed by and contact with respective terminals of the multi-pin device attached to a socket member, which will be described later with reference to FIGS. 6 through 8. Here, it is assumed that each of the terminals 1a, 1a, . . . is pressed by and contacts with a corresponding one of terminals of a multi-pin device such as a BGA semiconductor package with ball-like terminals (bumps) or an LGA semiconductor package with flat terminals (pads). Additionally, the micro-contact sheet 1 includes socket mounting holes 1c, 1c, . . . and positioning holes 1d. The micro-contact sheet 1 is positioned on a sheet mounting surface of the printed-wiring board 2 by using the positioning holes 1d.

The printed-wiring board 2 includes the rectangular sheet mounting surface for mounting the micro-contact sheet 1 thereon. The sheet mounting surface is provided with pads 2b, 2b, . . . corresponding to the pads 1b, 1b, . . . of the micro-contact sheet 1. In addition, socket mounting holes 2c, 2c, . . . , which serve as socket mounting portions, are provided in four places of the sheet mounting surface. More specifically, the socket mounting holes 2c, 2c, . . . are provided to surround the sheet mounting surface at the corners thereof. Further, the printed-wiring board 2 includes sheet positioning holes 2d corresponding to the positioning holes 1d of the micro-contact sheet 1. The socket mounting holes 2c, 2c, . . . are used as positioning holes for the sheet holding jig 3 in a reflowing process. It should be noted that, in this embodiment, a printed-wiring board to which the micro-contact sheet 1 is soldered is referred to as a substrate.

The sheet holding jig 3 is used as a mounting structure member in solder reflowing. When the micro-contact sheet 1 is soldered to the printed-wiring board 2 by reflowing, the sheet holding jig 3 presses the micro-contact sheet 1 against the printed-wiring board 2 at a constant pressure, so that the micro-contact sheet 1 is maintained to be flat with respect to the printed-wiring board 2 and firmly contacts with the printed-wiring board 2. In this embodiment, the sheet holding jig 3 is made of a box-shaped heat-resistant resin or metal plate having a predetermined weight so that the above-mentioned sheet holding function is achieved. By utilizing the weight of the sheet holding jig 3, micro-contact sheet 1 is pressed against the printed-wiring board 2, and the micro-contact sheet 1 is held to be flat by the constant pressure. An absorption surface to be vacuum up by an automated machine is formed on top surface of the sheet holding jig 3. The bottom surface of the sheet holding jig 3 includes concave portions 3a, 3a, . . . corresponding to the terminals 1a, 1a, . . . of the micro-contact sheet 1, thereby forming a sheet pressing surface which uniformly press the micro-contact sheet 1 against the printed-wiring board 2 such that the micro-contact sheet 1 maintains to be flat. Further, the sheet holding jig 3 is provided with attachment portions 3c, 3c, . . . at the four corners on the bottom surface thereof. The attachment portions 3c, 3c, . . . serve as guiding members for attaching the sheet holding jig 3 to the printed-wiring board 2 via the micro-contact sheet 1 in the above-mentioned reflowing. At the time of the reflowing, the attachment portions 3c, 3c, . . . are fit in the socket mounting holes 1c of the micro-contact sheet 1 and the socket mounting holes 2c of the printed-wiring board 2. In this manner, the sheet holding jig 3 is positioned with respect to the micro-contact sheet 1 on the printed-wiring board 2.

Figure 2:
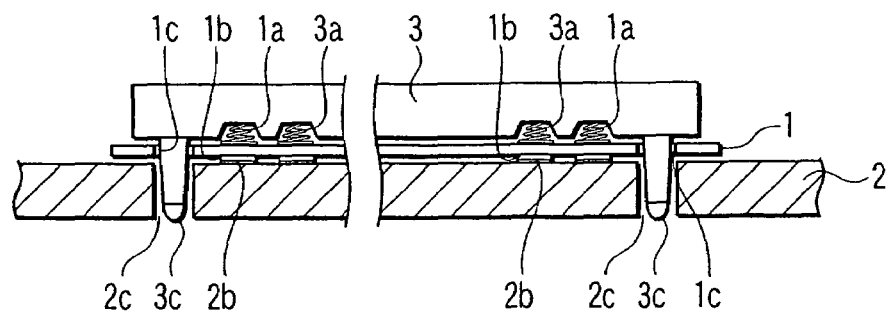
FIG. 2 is an exemplary cross-sectional view of the substrate structure according to the embodiment.

FIG. 2 shows an exemplary arrangement of each parts in a case where the micro-contact sheet 1 is soldered to the printed-wiring board 2 by using the sheet holding jig 3.

When soldering the micro-contact sheet 1 to the printed-wiring board 2, in a process before reflowing, a solder paste is applied by using, for example, a metal mask onto the pads 2b, 2b, . . . provided on the sheet mounting surface of the printed-wiring board 2.

The micro-contact sheet 1 is arranged on the pads 2b, 2b, . . . on which the solder paste is applied. The attachment portions 3c, 3c, . . . of the sheet holding jig 3 are fit in the socket mounting holes 1c of the micro-contact sheet 1; and are inserted in the socket mounting holes 2c of the printed-wiring board 2 by an automated machine. Thus, the micro-contact sheet 1 is pressed against the sheet mounting surface of the printed-wiring board 2 by the sheet holding jig 3. In this manner, the micro-contact sheet 1 is held by the sheet pressing surface of the sheet holding jig 3 in a state where the micro-contact sheet 1 is maintained to be flat. By performing solder reflowing in this state, the pads 1b, 1b, . . . of the micro-contact sheet 1 are solder bonded to the pads 2b, 2b, . . . of the printed-wiring board 2, and the micro-contact sheet 1 is soldered to the printed-wiring board 2.

At the time of the reflowing, the micro-contact sheet 1 is maintained to be flat by the sheet pressing surface of the sheet holding jig 3. Accordingly, the micro-contact sheet 1 is soldered to the printed-wiring board 2 in the state where the micro-contact sheet 1 is maintained to be flat. After this soldering, the sheet holding jig 3 is removed from the printed-wiring board 2. The mounting and removing of the sheet holding jig 3 is performed by the automated machine. The automated machine conveys the sheet holding jig 3 by vacuuming up the absorption surface of the sheet holding jig 3.

Figure 3:
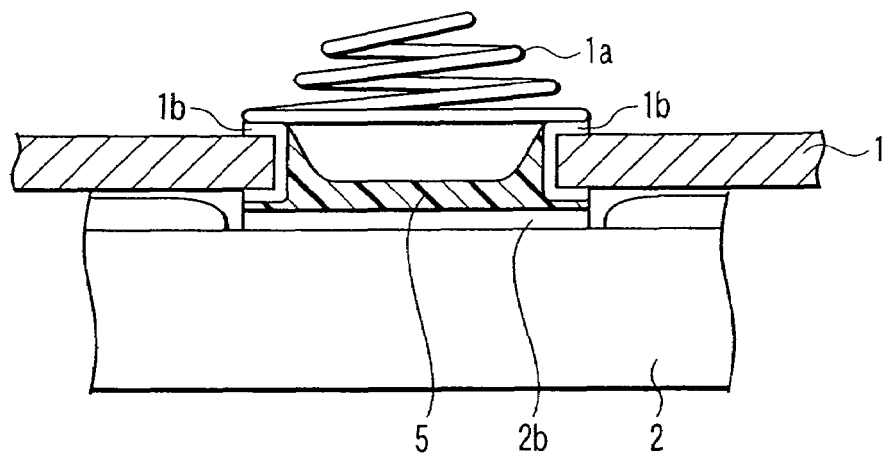
FIG. 3 is an exemplary enlarged cross-sectional view of a part of a micro-contact sheet according to the embodiment.

FIG. 3 shows a state of the micro-contact sheet 1 after the micro-contact sheet 1 is soldered to the printed-wiring board 2. The terminals 1a, 1a, . . . provided to the micro-contact sheet 1a, 1a, . . . are electrically connected to the corresponding pads 1b, 1b, . . . , and the pads 1b, 1b, . . . are solder bonded to the pads 2b, 2b, . . . of the printed-wiring board 2 by a solder 5. Accordingly, each of the terminals 1a, 1a, . . . is electrically connected to the corresponding one of the pads 2b, 2b, . . . of the printed-wiring board 2.

Figure 4:
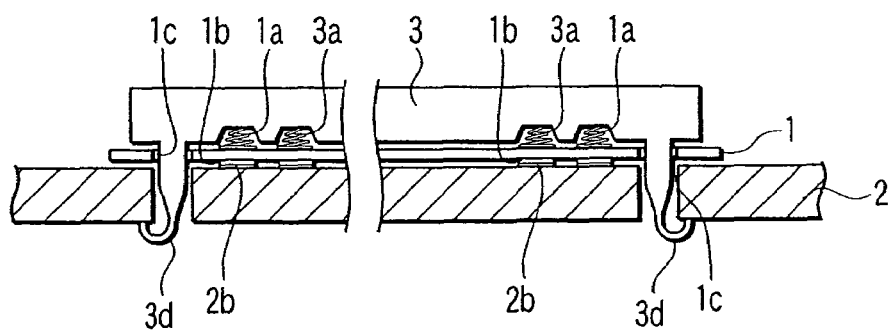
FIG. 4 is an exemplary cross-sectional view of a variation of a sheet holding jig according to the embodiment.

FIG. 4 shows a variation of the sheet holding jig 3. The sheet holding jig 3 shown in FIG. 4 differs from the sheet holding jig 3 shown in FIGS. 1 and 2 in that the attachment portions 3c, 3c, . . . are provided with engaging hooks. More specifically, the micro-contact sheet 1 is pressed against the printed-wiring board 2 by engaging the hooks with a surface of the printed-wiring board 2 and fixing the sheet holding jig 3 to the printed-wiring board 2. The shape of the hooks is not limited to that shown in FIG. 4, and an arbitrary shape may be applied to the hooks. It should be noted that, after solder reflowing, the sheet holding jig 3 is removed from the printed-wiring board 2 by releasing the engagement state of the hooks.

In the above-mentioned embodiment, the terminals 1a, 1a, . . . of the micro-contact sheet 1 are formed into the spiral shape having the protruding end. However, the terminals 1a, 1a, . . . of the micro-contact sheet 1 may be formed into, for example, a general coil spring shape, a coil spring shape having an enlarged end portion, etc.

With the substrate structure according to the above-mentioned embodiment, the sheet holding jig 3 is placed on the micro-contact sheet 1 by being positioned by the attachment portions 3c, 3c, . . . at the time of reflowing. Thus, the sheet pressing surface of the sheet holding jig 3 is pressed against the printed-wiring board 2 by a constant pressure. Accordingly, the solder reflowing process is performed in a state where the micro-contact sheet 1 firmly contacts with the printed-wiring board 2, and is maintained to be flat.

Hence, each of the pads 1b, 1b, . . . of the micro-contact sheet 1 is positively and directly solder bonded to the corresponding one of the pads 2 of the printed-wiring board 2 with a uniform and given amount of solder. Accordingly, it is possible to mount the micro-contact sheet 1 on the printed-wiring board 2 in a reliable and stable circuit connection state.

Additionally, it is possible to reduce a heat capacity in reflowing since reflowing is performed only between the micro-contact sheet 1 and the pads of the printed-wiring board 2. Thus, it is possible to perform solder-bonding at a suitable solder melting temperature and with a high quality without causing a warp of the substrate due to heat in reflowing.

Further, the micro-contact sheet 1 is solder bonded to the printed-wiring board 2 while maintaining a flat state with respect to the printed-wiring board 2. Hence, the terminals 1a, 1a, . . . are arranged with a uniform height with respect to a substrate surface, and contact with all terminals of a mounted electronic component at a constant pressure. Accordingly, it is possible to achieve a reliable circuit connection with a mounted electronic component.

In addition, terminals of an electronic component are pressed against and contact with the terminals 1a, 1a, . . . or the micro-contact sheet 1. Thus, even if a substrate is warped by some factors or subjected to an external stress, such warp or stress can be flexibly absorbed by the micro-contact sheet 1 without affecting the micro-contact sheet 1 including the solder bonded portion. Accordingly, it is possible to maintain a reliable circuit connection state with respect to stresses such as warp of a substrate.

Additionally, the terminals 1a, 1a, . . . of the micro-contact sheet 1 contact with terminals (for example, ball-like terminals) of a mounted electronic component by receiving them at positions over the micro-contact sheet 1. Thus, it is unnecessary to form through holes in the printed-wiring board 2 which are required in the case where the ball-like terminals are received at the height of a surface of the micro-contact sheet 1. Accordingly, it is possible to simplify pattern formation of the printed-wiring board 2. It should be noted that the shape of the terminals 1a, 1a, . . . is not limited to the spiral shape having the protruding end. The shape of the terminals 1a, 1a, . . . may be a general coil spring shape, a coil spring shape having an enlarged end portion, etc. Additionally, the terminals which contact with the terminals 1a, 1a, . . . are not limited to the ball-like terminals, and may be terminals having a pin structure or a flat shape.

Referring to FIGS. 5 through 9, a description is given of an exemplary socket structure and an exemplary device structure using the substrate structure according to the above-mentioned embodiment.

Figure 5:
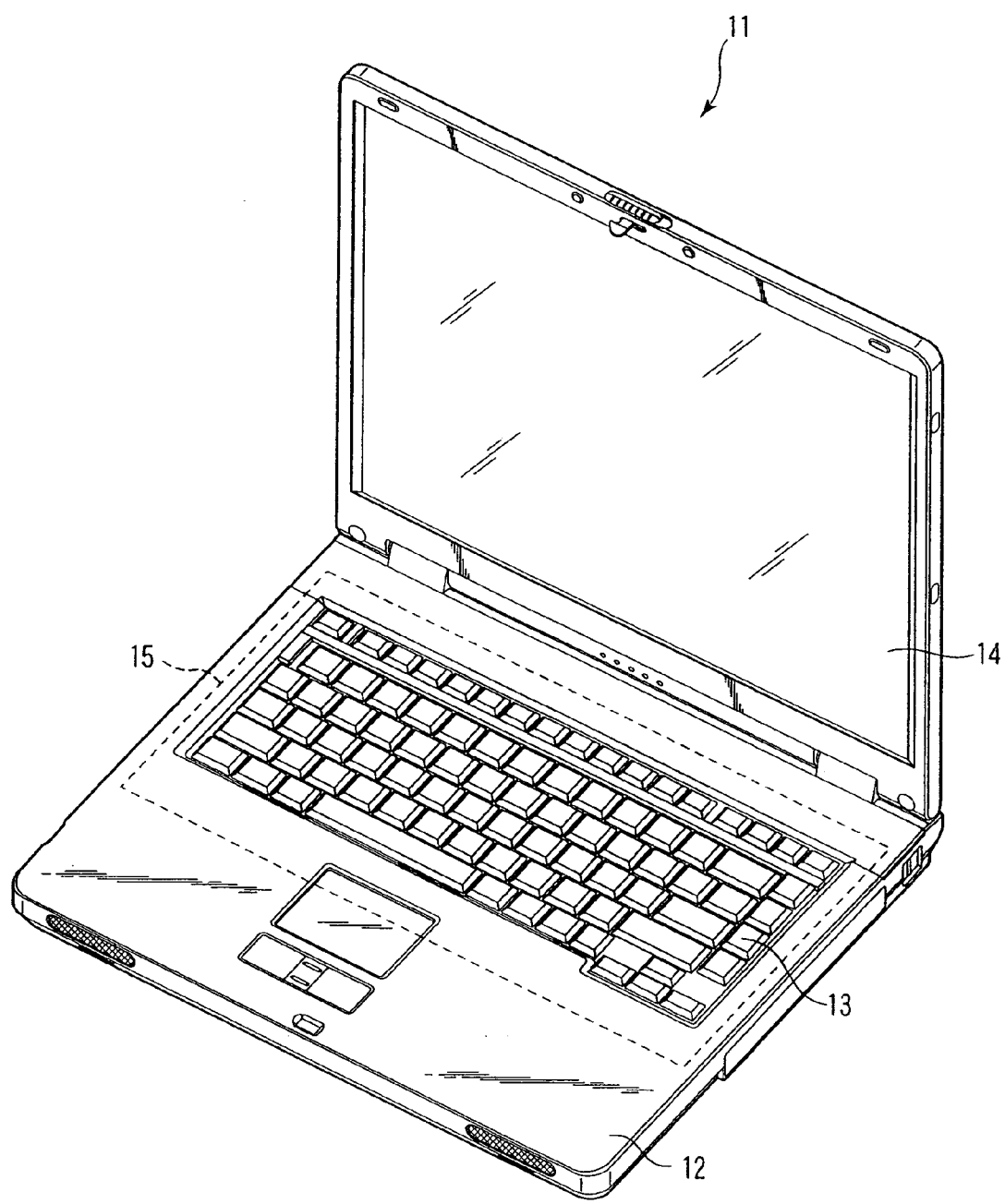
FIG. 5 is an exemplary perspective view of a portable computer using the substrate structure according to the embodiment.
Figure 6:
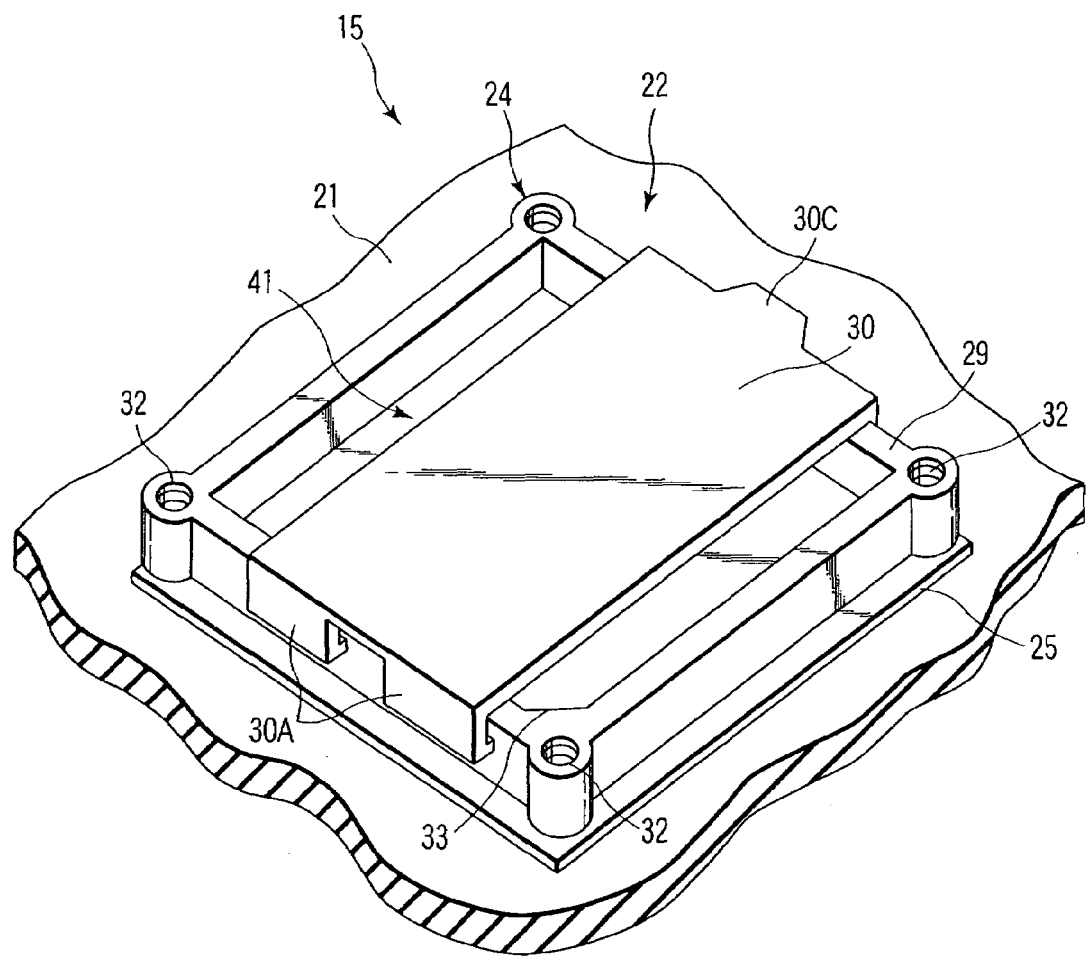
FIG. 6 is an exemplary perspective view of a part of the substrate structure to be housed in a housing of the portable computer shown in FIG. 5.
Figure 7:
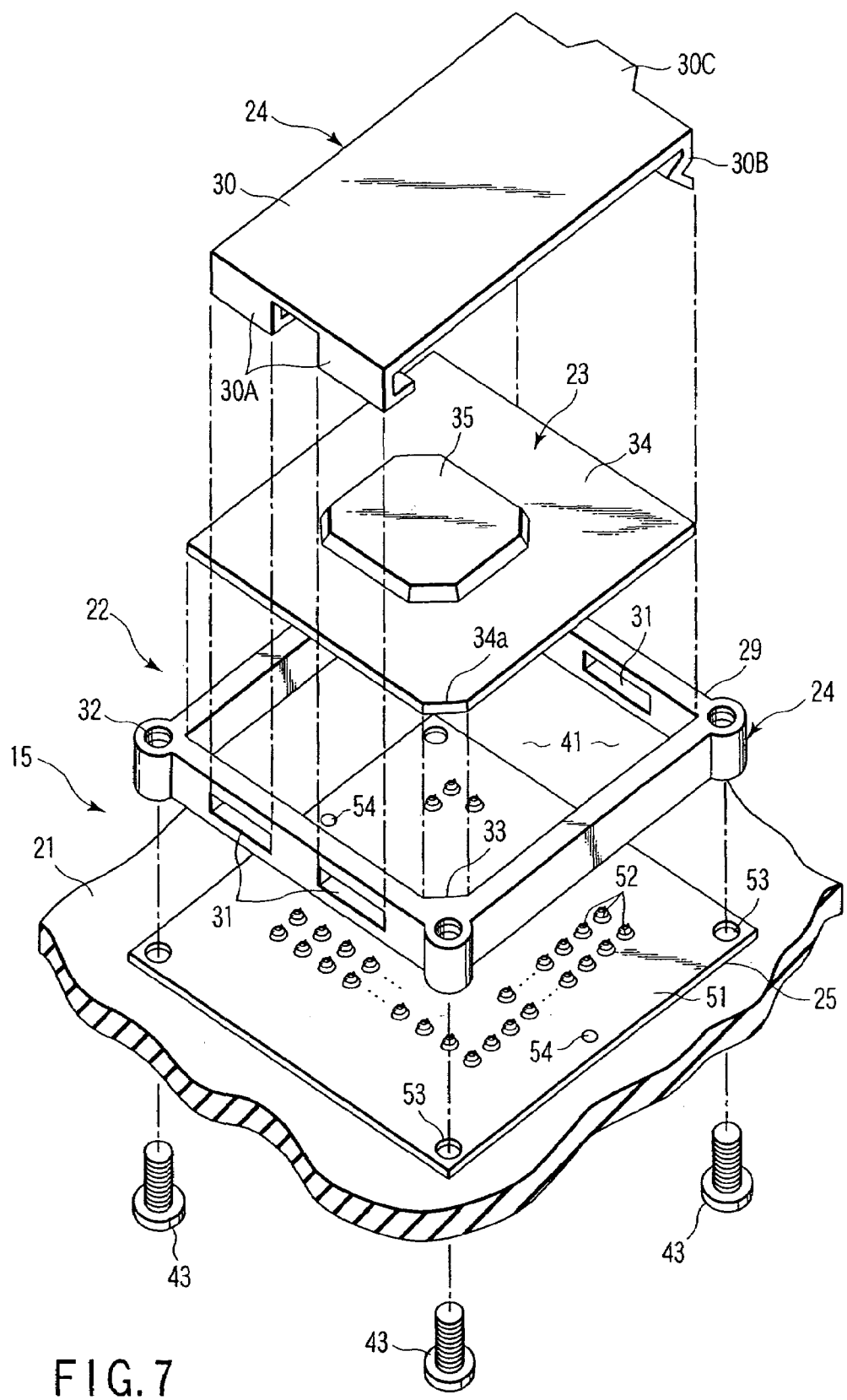
FIG. 7 is an exemplary exploded perspective view of the substrate structure shown in FIG. 6.
Figure 8:
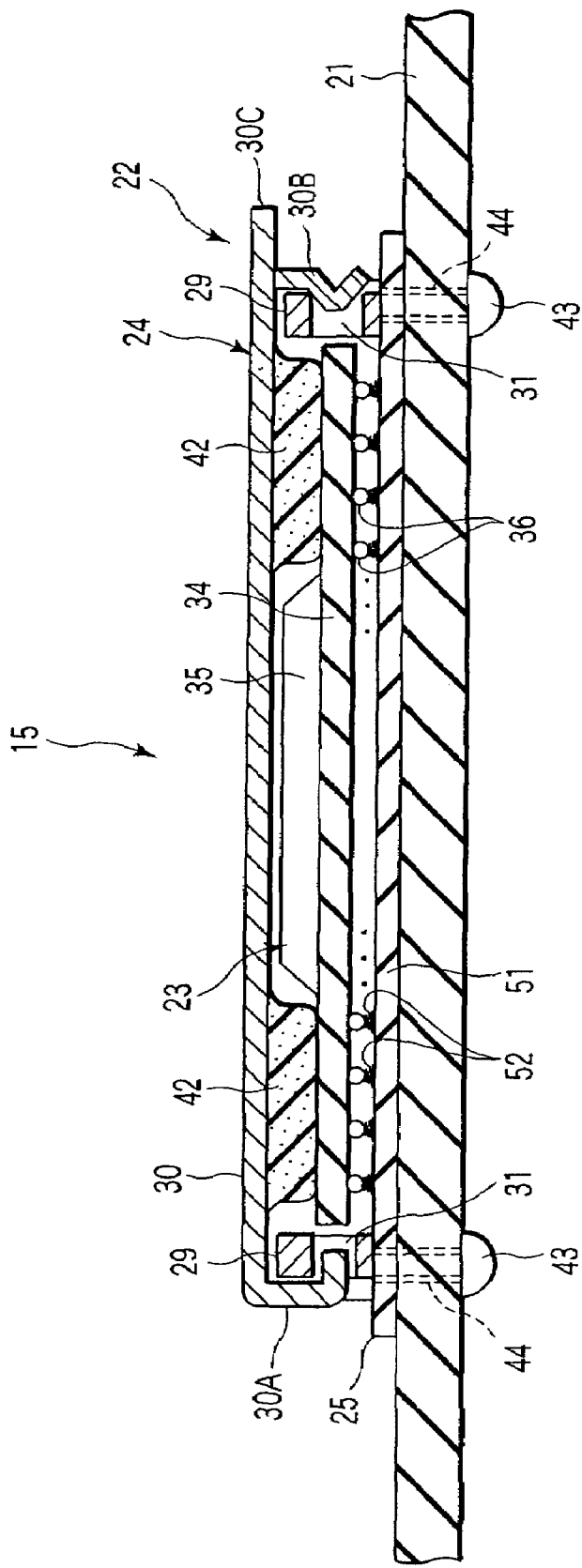
FIG. 8 is an exemplary cross-sectional view of the substrate structure shown in FIG. 6.

As shown in FIG. 5, a portable computer 11, which is an example of an electronic device, includes a housing 12, a keyboard 13, and a display 14. The housing 12 houses a printed-circuit board (PCB) 15. As shown in FIGS. 6 through 8, the printed-circuit board 15 includes a printed-wiring board 21, a component fixing device 22, and a BGA (Ball Grid Array) semiconductor package 23, which is an example of a circuit component. The component fixing device 22 includes a socket member 24 and a micro-contact sheet 25, which corresponds to the micro-contact sheet 1 shown in FIGS. 1 through 3.

The micro-contact sheet 25 is soldered to the printed-wiring board 21 by using the sheet holding jig 3 shown in FIGS. 1 and 2, while maintaining a flat state with respect to the printed-wiring board 21.

The socket member 24 includes a frame body 29 for surrounding the semiconductor package 23 and a cover 30 to be fixed to the frame body 29. The frame body 29 and the cover 30 are each made of an aluminum alloy which offers a high thermal conductivity and excellent heat radiation characteristics. The semiconductor package 23 can be housed in a region surrounded by the frame body 29.

The frame body 29 includes four caves 31 for fixing the cover 30. The frame body 29 also includes screw holes 32 at four places corresponding to the corners thereof. The frame body 29 is screwed and fixed to the printed-wiring board 21 at the four corners provided with the screw holes 32. The micro-contact sheet 25 is provided between the printed-wiring board 21 and the frame body 29 of the socket member 24.

The frame body 29 is provided with a projecting portion 33 for positioning the semiconductor package 23. The projecting portion 33 is shown in the lower half of FIG. 7. On the other hand, the semiconductor package 23 includes a substrate 34 and a resin mold 35 for housing a semiconductor element. The substrate 34 is provided with a notched portion 34a having a complementary shape with respect to the projecting portion 33. With the frame body 29, it is possible to position the semiconductor package 23 on the printed-wiring board 21. As shown in FIG. 8, a plurality of solder balls 36 are arranged on a bottom surface of the semiconductor package 23. The solder balls 36 are arranged in a lattice pattern.

The cover 30 covers a part of a region 41 surrounded by the frame body 29. The cover 30 includes a pair of hook portions 30A and a pair of joint portions 30B for fixing the cover 30 to the frame 29. Each of the hook portions 30A and the joint portions 30B corresponds to one of the four caves 31 of the frame body 29. The cover 30 includes a grip portion 30C for removing the cover 30.

As shown in FIG. 8, the cover 30 includes an elastic body 42 for pressing the semiconductor package 23 against the micro-contact sheet 25. The elastic body 42 is formed into a frame-like shape which butts the substrate 34 without contacting the resin mold 35.

The printed-wiring board 21 corresponds to the printed-wiring board 2 shown in FIGS. 1 through 3. The printed-wiring board 21 is formed by, for example, a copper-clad laminated plate obtained by stacking wiring layers made of copper. The printed-wiring board 21 is provided with engaging holes 44 through which inserted screw members 43 for screwing the socket member 24 to the printed-wiring board 21. The engaging holes 44 correspond to the socket mounting holes 2c shown in FIGS. 1 through 3. Here, the printed-wiring board 21 mounting a component thereon is referred to as a circuit substrate.

As shown in FIG. 8, the micro-contact sheet 25 includes a flexible sheet member 51 and a plurality of spiral terminals 52 which connect the semiconductor package 23 and the printed-wiring board 21 to each other. The spiral terminals 52 are arranged in a lattice pattern so as to correspond to the solder balls 36. The flexible sheet member 51 is a polyimide film having a thickness of a few to dozen of micrometers. As shown in FIG. 7, the flexible sheet member 51 is formed into a square shape and is provided with through holes 53 at the four corners thereof. The screw members 43 are inserted through the through holes 53. The through holes 53 correspond to the socket mounting holes 1c shown in FIGS. 1 through 3. Additionally, the flexible sheet member 51 is provided with holes 54 for positioning with respect to the printed-wiring board 21. The holes 54 correspond to the positioning holes 1d shown in FIG. 1. The micro-contact sheet 25 is soldered to the printed-wiring board 21 in a state where the micro-contact sheet is maintained to be flat with respect to the printed-wiring board 21 by using the sheet holding jig 3 shown in FIGS. 1 and 2. The terminals 52, 52, . . . provided on the micro-contact sheet 25 form a terminal connection surface of the socket member 24.

As shown in FIG. 8, when the semiconductor package 23 is attached to the socket member 24 and fixed to the component fixing device 22, the solder balls 36, 36, . . . of the semiconductor package 23 are pressed against and contact with the terminals 52, 52, . . . of the micro-contact sheet 25, and a circuit portion of the semiconductor package 23 attached to the socket member 24 is connected to the circuit board 21.

In the above-mentioned device structure, the micro-contact sheet 25 is soldered to the printed-wiring board 21 while maintaining a flat state with respect to the printed-wiring board 21. Hence, the terminals 52, 52, . . . are arranged with a uniform height with respect to the substrate surface, and contact with all of the solder balls 36, 36, . . . of the semiconductor package 23, serving as a mounted electronic component, at a constant pressure. Accordingly, it is possible to achieve a reliable circuit connection with the mounted electronic component. In addition, the terminals of the electronic component are pressed against and contact with the terminals 52, 52, . . . of the micro-contact sheet 25. Hence, even if the substrate is warped due to some factors or subjected to an external stress, the micro-contact sheet 25 can absorb such stress without affecting the component fixing device 22 and the semiconductor package 23 including the solder bonded portion. Accordingly, it is possible to maintain a reliable circuit connection state against stress such as a warp of the substrate, and to maintain a reliable and stable operation.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A substrate structure, comprising:
   a printed-wiring board;
   a micro-contact sheet soldered to the printed-wiring board, and including a spiral terminal on a first surface thereof and a pad on a second surface thereof, the pad being electrically connected to the spiral terminal; and
   a holding jig which presses the micro-contact sheet against the printed-wiring board such that the second surface of the micro-contact sheet contacts with the printed-wiring board.

2. The substrate structure according to claim 1, wherein the spiral terminal includes a protruding end.

3. The substrate structure according to claim 2, wherein the holding jig includes a first surface which presses the micro-contact sheet against the printed-wiring board, and a second surface which is vacuumed up by an automated machine, the first surface including a concave portion corresponding to the spiral terminal,
   wherein the holding jig is removed from the micro-contact sheet after the micro-contact sheet is soldered to the printed-wiring board.

4. The substrate structure according to claim 1, wherein the holding jig includes a first surface which presses the micro-contact sheet against the printed-wiring board, and a second surface which is vacuumed up by an automated machine, the first surface including a concave portion corresponding to the spiral terminal,
   wherein the holding jig is removed from the micro-contact sheet after the micro-contact sheet is soldered to the printed-wiring board.

5. The substrate structure according to claim 4, wherein the printed-wiring board includes a mounting portion for mounting a socket for mounting an electronic component on the micro-contact sheet, and the holding jig includes an engaging portion in the first surface thereof, the engaging portion engaging with the mounting portion.

6. The substrate structure according to claim 5, wherein the spiral terminal is pressed against and contacts with a terminal of the electronic component mounted to the socket at a position higher than the first surface of the micro-contact sheet, thereby establishing an electrical connection between the spiral terminal and the terminal of the electronic component.

7. The substrate structure according to claim 6, wherein the spiral terminal is pressed against and contacts with a ball-like terminal provided to the electronic component, thereby establishing an electrical connection between the spiral terminal and the terminal of the electronic component.

8. The substrate structure according to claim 6, wherein the spiral terminal is pressed against and contacts with a flat terminal provided to the electronic component, thereby establishing an electrical connection between the spiral terminal and the terminal of the electronic component.

9. The substrate structure according to claim 6, wherein the socket includes:
   a frame body contacting with a periphery of the micro-contact sheet; and
   a cover which is engaged with the frame body, presses the electronic component in a direction of a surface of the printed-wiring board, and maintains a state where the terminal of the electronic component is pressed against and contacts with the spiral terminal provided on the micro-contact sheet.

10. The substrate structure according to claim 9, wherein the frame body includes a first through hole, the micro-contact sheet includes a second through hole, each of the first through hole and the second through hole corresponding to the mounting portion of the printed-wiring board, the socket is fixed to the printed-wiring board by interposing the micro-contact sheet therebetween by using a fixing member which is inserted through the first through hole and the second through hole and is fixed to the mounting portion.

11. A substrate manufacturing method, comprising:
    pressing a micro-contact sheet against a printed-wiring board by a holding member such that the micro-contact sheet contacts with the printed-wiring board, the micro-contact sheet including a spiral terminal on a first surface thereof and a pad on a second surface thereof, the pad being electrically connected to the spiral terminal; and
    soldering the micro-contact sheet to the printed-wiring board.

* * * * *